United States Patent
Qiu et al.

(10) Patent No.: US 10,054,614 B2
(45) Date of Patent: Aug. 21, 2018

(54) TEST LEAD ASSEMBLY AND MEASUREMENT DEVICE

(71) Applicant: Fluke Corporation, Everett, WA (US)

(72) Inventors: Hua Qiu, Shanghai (CN); Duanjun Lu, Shanghai (CN); Jinbo He, Shanghai (CN)

(73) Assignee: Fluke Corporation, Everett, WA (US)

( * ) Notice: Subject to any disclaimer, the term of this patent is extended or adjusted under 35 U.S.C. 154(b) by 27 days.

(21) Appl. No.: 15/256,308

(22) Filed: Sep. 2, 2016

(65) Prior Publication Data
US 2017/0059614 A1 Mar. 2, 2017

(30) Foreign Application Priority Data
Sep. 2, 2015 (CN) .................. 2015 2 0674336 U

(51) Int. Cl.
| | |
|---|---|
| *G01R 1/20* | (2006.01) |
| *G01R 1/067* | (2006.01) |
| *G01R 13/20* | (2006.01) |
| *G01R 15/12* | (2006.01) |
| *G01R 19/00* | (2006.01) |
| *G01R 31/36* | (2006.01) |

(52) U.S. Cl.
CPC ......... *G01R 1/06788* (2013.01); *G01R 13/20* (2013.01); *G01R 15/125* (2013.01); *G01R 19/0084* (2013.01); *G01R 31/3644* (2013.01)

(58) Field of Classification Search
CPC ............ G01R 31/2894; G01R 31/2853; G11C 29/022; G11C 29/816
USPC .................................. 324/71.11, 73.1, 76.11
See application file for complete search history.

(56) References Cited

U.S. PATENT DOCUMENTS

| | | | |
|---|---|---|---|
| 5,949,026 A | 9/1999 | DeFlorio | |
| 6,617,972 B2* | 9/2003 | Takarada | G08B 21/0484 324/538 |
| 7,365,561 B2* | 4/2008 | Ito | G01R 1/06761 324/754.07 |
| 8,779,729 B2* | 7/2014 | Shiraishi | G01R 31/3606 320/134 |
| 2001/0031040 A1* | 10/2001 | Kaine | H04M 1/24 379/21 |
| 2012/0045084 A1 | 2/2012 | Groset et al. | |
| 2012/0098518 A1* | 4/2012 | Unagami | G01R 22/066 324/74 |

(Continued)

OTHER PUBLICATIONS

Extended European Search Report, dated Feb. 8, 2017, for European Application No. 16186893.0-1568 / 3139182, 6 pages.

*Primary Examiner* — Giovanni Astacio-Oquendo
(74) *Attorney, Agent, or Firm* — Seed IP Law Group LLP

(57) ABSTRACT

A test lead assembly includes a first test lead having a first cable extending between a distal end and a proximal end, a first test probe attached to the distal end and a first plug attached to the proximal end; a second test lead having a second cable extending between a distal end and a proximal end, a second test probe attached to the distal end, and a second plug attached to the proximal end; and a fastener member for repeatedly releasably engaging at least a portion of the first cable with at least a portion of the second cable along a length of the first and second cables. The test lead assembly and a measurement device incorporating the test lead assembly can avoid or at least reduce knotting of the test leads.

31 Claims, 1 Drawing Sheet

(56) References Cited

U.S. PATENT DOCUMENTS

2012/0170789 A1 7/2012 Lin
2012/0307981 A1* 12/2012 Larkin ................ H01H 9/0228
379/27.01

* cited by examiner

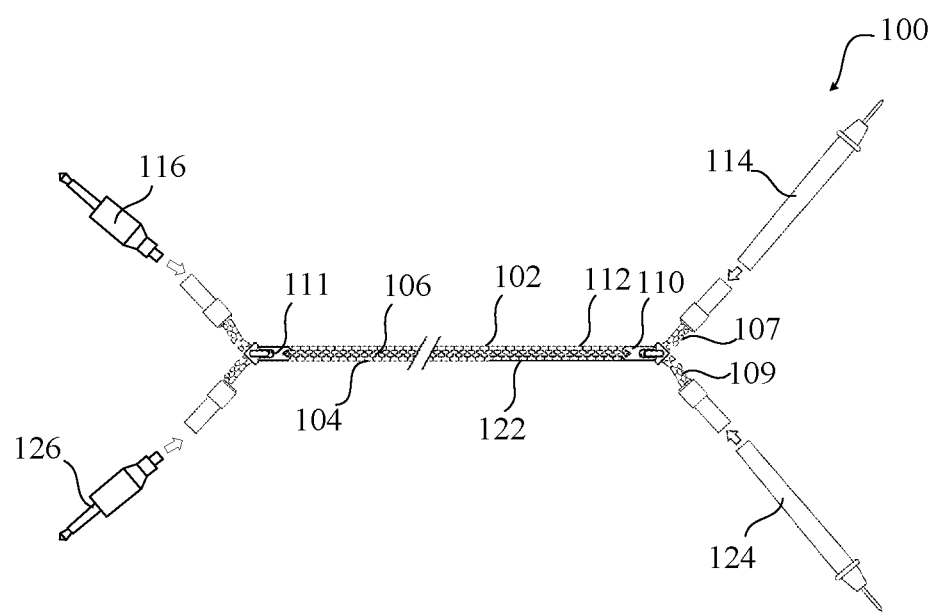

TEST LEAD ASSEMBLY AND MEASUREMENT DEVICE

TECHNICAL FIELD

The present disclosure generally relates to electronic measurement technology, and more particularly, to a test lead assembly and a measurement device incorporating the test lead assembly.

BACKGROUND

Various measurement devices for measuring electrical parameters (such as voltage, current and impedance) are widely used in industrial production and daily life. A multi-meter is a typical electrical parameter measurement device, which is mainly used to measure voltage, current or impedance in either alternating form or direct form. The multi-meter typically has a body and a pair of test leads. A test probe at one end of each test lead is connected to a device or a component under test, and a plug at the other end is plugged into a corresponding jack on the body of the multi-meter, thereby electrically connecting the device under test with a measurement circuit inside the body of the multi-meter.

When using the multi-meter for measurement, an operator often needs to hold the two test probes using his or her hands, respectively, to connect them stably to two test points of the device under test. When multiple times of measurements are required, the locations of the test points may change, and thus the operator needs to move the test probes continuously. In some cases, the changes of the locations of the test probes may make the two test leads intertwined even knotted with each other, which may adversely affect a movable range of the test probes.

Therefore, there is a need to provide a test lead assembly which can avoid or at least reduce knotting of test leads.

SUMMARY

An objective of the application is to provide a test lead assembly and measurement device that can avoid or at least reduce knotting of test leads.

According to an aspect of the application, a test lead assembly is provided, which comprises a first test lead having a first cable extending between a distal end and a proximal end, a first test probe attached to the distal end and a first plug attached to the proximal end, and a second test lead having a second cable extending between a distal end and a proximal end, a second test probe attached to the distal end, and a second plug attached to the proximal end. The test lead assembly further comprises a fastener member for repeatedly releasably engaging at least a portion of the first cable with at least a portion of the second cable along a length of the first and second cables.

With the fastener member, the test lead assembly of the embodiment of the application can engage its test leads with each other or release them after the engagement. Therefore, in operation, the two test leads can be engaged with each other to avoid intertwining or knotting. Furthermore, when test points of a device or component under test change, the engaged length of the two test leads may be adjusted according to the test requirement, thereby avoiding limiting the movable scope between the test probes.

In some embodiments, the fastener member is a zipper fastener which comprises: a first interlocking profile formed on an outer surface of the first cable; a second interlocking profile formed on an outer surface of the second cable; and a zipper slider for engaging the first interlocking profile with the second interlocking profile and releasing the engaged first interlocking profile from the second interlocking profile.

In some embodiments, the zipper slider is configured to engage the first interlocking profile with the second interlocking profile in a forward direction from the proximal ends of the first and second cables to the distal ends of the first and second cables, and to release the first interlocking profile from the second interlocking profile in a reverse direction opposite to the forward direction.

In some embodiments, the zipper fastener further comprises a second zipper slider for engaging the first interlocking profile with the second interlocking profile in the reverse direction and releasing the first interlocking profile from the second interlocking profile in the forward direction.

In some embodiments, the test lead assembly further comprises a bottom stopper mounted onto the proximal ends of the first and second cables to connect the proximal ends together.

In some embodiments, the test lead assembly further comprises an insertion pin and a pin box mounted onto the proximal ends of the first and second cables, respectively, to allow joining of the first and second cables.

In some embodiments, the first and second interlocking profiles are two rows of interlocking teeth or two interlocking strips.

In some embodiments, the first cable is shorter than the second cable and the first interlocking profile extends an entire length of the first cable.

In some embodiments, the first test probe is removably attached to the distal end of the first cable, and/or the second test probe is removably attached to the distal end of the second cable.

According to another aspect of the application, a measurement device is also provided, which comprises the test lead assembly of the above aspect, and a measurement body to which the test lead assembly is attached.

In some embodiments, the measurement device is a digital multi-meter, a battery tester, an oscilloscope, or a voltmeter.

According to another aspect of the application, a test lead assembly is further provided, which comprises a first test lead having a first cable extending between a distal end and a proximal end thereof, a first distal end joint disposed at the distal end and a first proximal end joint disposed at the proximal end, and a second test lead having a second cable extending between a distal end and a proximal end thereof, a second distal end joint disposed at the distal end, and a second proximal end joint disposed at the proximal end. The test lead assembly further comprises a fastener member for repeatedly releasably engaging at least a portion of the first cable with at least a portion of the second cable along a length of the first and second cables, wherein each of the first and second proximal end joints is configured to couple with a plug, and each of the first and second distal end joints is configured to couple with a test probe.

The foregoing has outlined, rather broadly, features of the present application. Additional features of the present application will be described hereinafter. It should be appreciated by those skilled in the art that the conception and specific embodiments disclosed herein may be readily utilized as a basis for modifying or designing other structures or processes for carrying out the objectives of the present application. It should also be realized by those skilled in the art that such equivalent constructions do not depart from the spirit and scope of the present application as set forth in the appended claims.

BRIEF DESCRIPTION OF THE DRAWINGS

The aforementioned features and other features of the present application will be fully understood by reading the following description by referring to the accompanying drawings and the appended claims. It will be understood that, these accompanying drawings merely illustrate certain embodiments in accordance with the present application and should not be considered as limitation to the scope of the present application. Unless otherwise specified, the accompanying drawings need not be proportional, and similar reference characters generally denote similar elements.

FIG. 1 illustrates a schematic diagram of a test lead assembly according to an embodiment of the present application.

DETAILED DESCRIPTION OF THE EMBODIMENTS

The following detailed description refers to the accompanying drawing which is a part of the present application. The illustrative embodiments described in the detailed description, the accompanying drawing and the claims are not limiting, and other embodiments may be adopted, or modifications may be made without deviating from the spirit and subject of the present application. It should be understood that the various aspects of the present application described and graphically presented herein may be arranged, replaced, combined, divided and designed in many different configurations, and these different configurations are implicitly comprised in the present application.

FIG. 1 illustrates a test lead assembly 100 according to an embodiment of the application. In implementations, the test lead assembly 100 may be connected to a measurement body (with a measurement circuit) as a part of a measurement device. The measurement device may be a digital multi-meter, a battery tester, an oscilloscope, a voltmeter or other electrical measurement devices, which can be used to measure the voltage, current, resistance, capacitance or other electrical parameters of a device or component under test.

As illustrated in FIG. 1, the test lead assembly includes a first test lead 102, a second test lead 104, and a fastener member 106. The first test lead 102 and the second test lead 104 can be used to electrically connect the device under test to the measurement body so that the electrical parameters, such as voltage, of a test point(s) of the device under test can be delivered to the measurement body. The fastener member 106 can be used to mechanically connect the first test lead 102 to the second test lead 104, and such connection can be released or re-engaged repeatedly.

The first test lead 102 includes a first cable 112, a first test probe 114 and a first plug 116. The first cable 112 has a distal end and a proximal end opposite to the distal end, and the first cable 112 extends between the first end and the proximal end. In the present application, the proximal end refers to an end of the test lead relatively close to the measurement body, and the distal end refers to the other end of the test lead relatively far away from the measurement body. During measurement operations, compared to the proximal end, the distal end is closer to the device under test. The first cable 112 may be any conductive wires such as metal wires or metal-alloy wires, or copper wires, silver wires, copper-alloy wires and the like, which can be coated with an insulation layer.

The first test probe 114 is attached to the distal end of the first cable 112. The first test probe 114 may be removably attached to the distal end of the first cable 112, or may be fixedly attached to the distal end of the first cable 112. In some embodiments, the first cable 112 has a first distal end joint disposed at its distal end, which is suitable for coupling with the first test probe 114. For example, a tail of the first test probe 114 may have an internal thread, and the distal end of the first cable 112 may have a cylindrical rod with an external thread. The distal end of the first cable 112 and the tail of the first test probe 114 can be connected together by coupling their respective threads together, and may be separated if desired. For example, the first cable 112 can be connected with different types of test probes, and the test probe to be connected may vary according to different devices or components if desired. Similarly, the first plug 116 is attached to the proximal end of the first cable 112, such as removably or fixedly attached to the proximal end of the first cable 112. In some embodiments, the first cable 112 may have the first proximal end joint at its proximal end, which is suitable for coupling with the first plug 116. The first plug 116 may mate with a jack on the measurement body of the digital multi-meter or other measurement devices, and have a shape such as a banana shape, a needle shape or a cross-recessed shape.

The second test lead 104 includes a second cable 122, a second test probe 124, and a second plug 126. The structure of the second test lead 104 is similar to that of the first test lead 102, which is not elaborated herein. In some embodiments, the second cable 122 may have a second distal end joint disposed at its distal end, which is suitable for coupling with the second test probe 124. The second cable 122 may further have a second proximal end joint disposed at its proximal end, which is suitable for coupling with the second plug 126.

As mentioned above, in some embodiments, the cables of the test lead assembly may have joints for coupling with plugs or test probes. Correspondingly, the plugs and test probes may be additionally included as optional parts of the test lead assembly. Preferably, the joints may be formed with a general or standard joint shape for coupling with various types of plugs and/or test probes.

The length of the first cable 112 and the second cable 122 may be determined according to practical requirements. In some embodiments, the second cable 122 is longer than the first cable 112. In other embodiments, the length of the second cable 122 is equal to or smaller than that of the first cable 112.

The test lead assembly 100 also includes a fastener member for repeatedly releasably engaging at least a portion of the first cable 112 with at least a portion of the second cable 122 along a length of the first and second cables. If desired, the fastener member may at least partially engage the first cable 112 with the second cable 122 together, to reduce the separated length of the two cables. This helps to avoid or reduce intertwining or knotting of the two cables. Moreover, in some situations, the fastener member may release the engaged parts of the first cable 112 and the second cable 122 to increase the separated length of the two cables. In this way, the first test probe 114 and the second test probe 124, which are attached to the first cable 112 and the second cable 122 respectively, may depart further from each other for connecting with two test points farther away from each other. If desired, the fastener member may engage the first cable 112 with the second cable 122, then release them, then engage again, then release again, and so forth.

In some embodiments, the fastener member is a zipper fastener or any other suitable fasteners which can release two engaged cables. In the embodiments shown in FIG. 1, the fastener member 106 is a zipper fastener. The zipper fastener 106 may include a first interlocking profile 107 formed on an outer surface of the first cable 112, a second interlocking profile 109 formed on an outer surface of the second cable 122 and a zipper slider 110. The first interlocking profile 107 may engage with the second interlocking profile 109, such as meshing with it. The zipper slider 110 is used for engaging the first interlocking profile 107 with the second interlocking profile 109, and for releasing the engaged first interlocking profile 107 from the second interlocking profile 109. In some embodiments, the zipper slider 110 may engage the first interlocking profile 107 with the second interlocking profile 109 in a forward direction, which is from the proximal ends of the first and second cables to the distal ends of the first and second cables. Moreover, the zipper slider 110 may also release the first interlocking profile 107 from the second interlocking profile 109 in a reverse direction opposite to the forward direction, which is from the distal ends of the first and second cables to the proximal ends of the first and second cables. The first interlocking profile 107 and the second interlocking profile 109 may be attached onto the respective outer surfaces of the first and second cables by bonding, sewing, preforming or clamping. For example, the first and second interlocking profiles may be formed on the respective insulation surfaces of the first and second cables, or formed on two additional sleeves which are attached to the outer surface of the first and second cables, respectively. In some embodiments, the first interlocking profile 107 and the second interlocking profile 109 are integrally formed with the first and second cables.

In some embodiments, the first interlocking profile 107 is a row of interlocking teeth, and the second interlocking profile 109 is another row of interlocking teeth. The two rows of interlocking teeth may be made of metal or plastic materials, which can be engaged with or released from each other by the zipper slider, such that the first cable 112 and the second cable 122 can be repeatedly engaged or disengaged to change the engaged length of the two cables. When an operator is measuring two test points of an object under test using the test lead assembly, the zipper slider can engage the first cable 112 with the second cable 122 along a predetermined length to avoid or reduce the intertwining or knotting between the first cable 112 and the second cable 122. In case that the two test points are farther away from each other, the movable range between the first test probe 114 and the second test probe 12 can be increased by pulling the zipper slider 110 to release the engaged portion of the first cable 112 and the second cable 122. In other embodiments, the first interlocking profile 107 and the second interlocking profile 109 may be two interlocking strips, which can be attached onto the outer surfaces of the first cable 112 and the second cable 122 by bonding, sewing or other ways, or may be formed integrally with the outer surface of the first cable 112 and the second cable 122. In some embodiments, the interlocking strips can be obtained by processing the insulation layers of the first and second cables, such as by plastic molding. For example, the first interlocking strip can be formed with a groove extending from the proximal end to the distal end of the first cable 112, and the second interlocking strip can be formed with a ridge extending form the proximal end to the distal end of the second cable 122. Furthermore, the cross-sectional width of the ridge is generally equal to the cross sectional width of the groove, such that the ridge can be embedded into the groove to provide a proper force for engaging the first cable 112 with the second cable 122. Under the guidance of the zipper slider, the ridge can be clamped into the groove, or the ridge clamped into the groove can be released from the groove, thereby engaging the first and second interlocking strips or releasing them from each other.

In some embodiments, the first interlocking profile may extend an entire length of the first cable, or the second interlocking profile may extend an entire length of the second cable. In some embodiments, the first cable may be shorter than the second cable, and the first interlocking profile may extend the entire length of the first cable. Therefore, the second cable may extend certain length beyond the first cable, which provides a distance between the two test probes sufficient for connecting with two test points separated by a relatively long distance.

In some embodiments, the test lead assembly may include a bottom stopper (not shown). In some embodiments, the bottom stopper may be fixed at the proximal ends of the first and second cables, and connect the proximal ends of the first and second cables together. As the zipper slider moves to the bottom stopper, the bottom stopper can prevent the zipper slider from sliding out of the first or second cables. The bottom stopper can also prevent the first cable and the second cable from complete separation. In some embodiments, the bottom stopper can be placed close to the proximal ends of the first and second cables but a little distant from the first and second plugs, such as 1 cm, 2 cm, 5 cm or 10 cm from the first and second plugs. In this way, the bottom stopper will not hamper the movable range of the first and second plugs at the proximal ends. In addition, either or both of the proximal ends of the first and second cables and the tails of the first and second plugs (the ends near the proximal ends of the cables) may be made of flexible or elastic materials for permitting slight movement or rotation of the first and second plugs, such that the plugs can adjust to various measurement bodies with different jack arraignments. Optionally, a pair of top stoppers may be disposed at the respective distal ends of the first and second cables, substantially equally distant from the respective bottom stoppers. The top stoppers may prevent the zipper slider from sliding out of the distal ends of the first and second cables.

In some embodiments, an insertion pin (not shown) and a pin box (not shown) may be mounted onto the proximal ends of the first and second cables, respectively. When the insertion pin is inserted into the pin box, the proximal ends of the first and second cables are connected together. When the zipper slider moves in the reverse direction to release the first interlocking profile from the second interlocking profile, the insertion pin may depart form the pin box through the zipper slider, thereby completely separating the first and second cables. Similarly, a pair of top stoppers may be positioned at the distal ends of the first and second cables and aligned with each other in position.

Still referring to FIG. 1, the zipper fastener 106 may also include a second zipper slider 111 for engaging the first interlocking profile 107 with the second interlocking profile 109 in the reverse direction and releasing the first interlocking profile 107 from the second interlocking profile 109 in the forward direction. When the test lead assembly 100 is used with measurement bodies with different jack distances, the test lead assembly with the second zipper slider 111 may allow the operator to adjust the distance between the first plug 116 and the second plug 126, such that the test lead assembly 100 can be adapted for different types of measurement bodies.

The present application also provides a measurement device, which includes a measurement body and any of the test lead assemblies of embodiments of the present application. The test lead assembly may be connected to the measurement body. The measurement body has jacks matching with the first and second plugs, and the plugs can be plugged into the jacks for electrical connecting a measurement circuit inside the measurement body. Specifically, the measurement device may be a digital multi-meter, a battery tester, an oscilloscope, or a voltmeter.

It should be noted that, although several modules or sub-modules of certain portable measurement devices are described in the detailed description above, such classification is merely exemplary rather than mandatory. In fact, according to the embodiments of the present application, features or functions of two or more modules described above can be embodied in a single module. On the contrary, features or functions of a module described above can be further embodied in several separate modules.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Any reference signs in the claims should not be construed as limiting the scope.

The invention claimed is:

1. A test lead assembly comprising:
   a first test lead having a first cable extending between a distal end and a proximal end, a first test probe attached to the distal end and a first plug attached to the proximal end;
   a second test lead having a second cable extending between a distal end and a proximal end, a second test probe attached to the distal end, and a second plug attached to the proximal end; and
   a fastener member for repeatedly releasably engaging at least a portion of the first cable with at least a portion of the second cable along a length of the first and second cables.

2. The test lead assembly of claim 1, wherein the fastener member is a zipper fastener that comprises:
   a first interlocking profile formed on an outer surface of the first cable;
   a second interlocking profile formed on an outer surface of the second cable; and
   a zipper slider for engaging the first interlocking profile with the second interlocking profile and releasing the engaged first interlocking profile from the second interlocking profile.

3. The test lead assembly of claim 2, wherein the zipper slider is configured to engage the first interlocking profile with the second interlocking profile in a forward direction from the proximal ends of the first and second cables to the distal ends of the first and second cables, and to release the first interlocking profile from the second interlocking profile in a reverse direction opposite to the forward direction.

4. The test lead assembly of claim 3, wherein the zipper fastener further comprises a second zipper slider for engaging the first interlocking profile with the second interlocking profile in the reverse direction and releasing the first interlocking profile from the second interlocking profile in the forward direction.

5. The test lead assembly of claim 2, further comprising:
   a bottom stopper mounted onto the proximal ends of the first and second cables to connect the proximal ends together.

6. The test lead assembly of claim 2, further comprising:
   an insertion pin and a pin box mounted onto the proximal ends of the first and second cables, respectively, to allow joining of the first and second cables.

7. The test lead assembly of claim 2, wherein the first and second interlocking profiles are two rows of interlocking teeth or two interlocking strips.

8. The test lead assembly of claim 2, wherein the first cable is shorter than the second cable and the first interlocking profile extends an entire length of the first cable.

9. The test lead assembly of claim 1, wherein the first test probe is removably attached to the distal end of the first cable, and/or the second test probe is removably attached to the distal end of the second cable.

10. A measurement device comprising:
    a test lead assembly including:
       a first test lead having a first cable extending between a distal end and a proximal end, a first test probe attached to the distal end and a first plug attached to the proximal end;
       a second test lead having a second cable extending between a distal end and a proximal end, a second test probe attached to the distal end, and a second plug attached to the proximal end; and
       a fastener member for repeatedly releasably engaging at least a portion of the first cable with at least a portion of the second cable along a length of the first and second cables; and
    a measurement body to which the test lead assembly is attached.

11. The measurement device of claim 10, wherein the measurement device is a digital multi-meter, a battery tester, an oscilloscope, or a voltmeter.

12. The measurement device of claim 10, wherein the fastener member is a zipper fastener that comprises:
    a first interlocking profile formed on an outer surface of the first cable;
    a second interlocking profile formed on an outer surface of the second cable; and
    a zipper slider for engaging the first interlocking profile with the second interlocking profile and releasing the engaged first interlocking profile from the second interlocking profile.

13. The measurement device of claim 12, wherein the zipper slider is configured to engage the first interlocking profile with the second interlocking profile in a forward direction from the proximal ends of the first and second cables to the distal ends of the first and second cables, and to release the first interlocking profile from the second interlocking profile in a reverse direction opposite to the forward direction.

14. The measurement device of claim 13, wherein the zipper fastener further comprises a second zipper slider for engaging the first interlocking profile with the second interlocking profile in the reverse direction and releasing the first interlocking profile from the second interlocking profile in the forward direction.

15. The measurement device of claim 12, further comprising:
    a bottom stopper mounted onto the proximal ends of the first and second cables to connect the proximal ends together.

16. The measurement device of claim 12, further comprising:
an insertion pin and a pin box mounted onto the proximal ends of the first and second cables, respectively, to allow joining of the first and second cables.

17. The measurement device of claim 12, wherein the first and second interlocking profiles are two rows of interlocking teeth or two interlocking strips.

18. The measurement device of claim 12, wherein the first cable is shorter than the second cable and the first interlocking profile extends an entire length of the first cable.

19. The measurement device of claim 10, wherein the first test probe is removably attached to the distal end of the first cable, and/or the second test probe is removably attached to the distal end of the second cable.

20. A test lead assembly, comprising:
a first test lead having a first cable extending between a distal end and a proximal end thereof, a first distal end joint disposed at the distal end and a first proximal end joint disposed at the proximal end, wherein the first proximal end joint is configured to couple with a plug, and the first distal end joint is configured to couple with a test probe;
a second test lead having a second cable extending between a distal end and a proximal end thereof, a second distal end joint disposed at the distal end, and a second proximal end joint disposed at the proximal end, wherein the second proximal end joint is configured to couple with a plug, and the second distal end joint is configured to couple with a test probe; and
a fastener member for repeatedly releasably engaging at least a portion of the first cable with at least a portion of the second cable along a length of the first and second cables.

21. A test lead assembly comprising:
a first test lead having a first cable extending between a distal end and a proximal end, with a first test probe attached to the distal end of the first cable and a first plug attached to the proximal end of the first cable;
a second test lead having a second cable extending between a distal end and a proximal end, with a second test probe attached to the distal end of the second cable and a second plug attached to the proximal end of the second cable; and
a fastener member for repeatedly releasably engaging at least a portion of the first cable with at least a portion of the second cable along a length of the first and second cables,
wherein the fastener member is a zipper fastener which comprises:
a first interlocking profile integrally formed on an outer surface of the first cable;
a second interlocking profile integrally formed on an outer surface of the second cable;
a first zipper slider for engaging the first interlocking profile with the second interlocking profile in a forward direction from the proximal ends of the first and second cables to the distal ends of the first and second cables, and releasing the engaged first interlocking profile from the second interlocking profile in a reverse direction opposite to the forward direction; and
a second zipper slider for engaging the first interlocking profile with the second interlocking profile in the reverse direction and releasing the first interlocking profile from the second interlocking profile in the forward direction.

22. The test lead assembly of claim 21, further comprising:
a bottom stopper mounted onto the proximal ends of the first and second cables to connect the proximal ends together.

23. The test lead assembly of claim 21, further comprising:
an insertion pin and a pin box mounted onto the proximal ends of the first and second cables, respectively, to allow joining of the first and second cables.

24. The test lead assembly of claim 21, wherein the first and second interlocking profiles are two rows of interlocking teeth.

25. The test lead assembly of claim 21, wherein the first cable is shorter than the second cable and the first interlocking profile extends an entire length of the first cable.

26. The test lead assembly of claim 21, wherein the first test probe is removably attached to the distal end of the first cable, and/or the second test probe is removably attached to the distal end of the second cable.

27. The test lead assembly of claim 21, wherein the fastener member is comprised of two interlocking strips in which the first interlocking profile is a first interlocking strip and the second interlocking profile is a second interlocking strip.

28. The test lead assembly of claim 27, wherein the first interlocking strip comprises a groove extending from the proximal end to the distal end of the first cable, and the second interlocking strip comprises a ridge extending from the proximal end to the distal end of the second cable, and wherein the cross-sectional width of the ridge is generally equal to the cross-sectional width of the groove such that the ridge can be embedded into the groove to engage the first cable with the second cable.

29. The test lead assembly of claim 28, wherein the first and second zipper sliders clamp the ridge into the groove or release the ridge from the groove, thereby engaging the first and second interlocking strips or releasing them from each other.

30. The test lead assembly of claim 21, wherein the test lead assembly is connected to a measurement body as a part of a measurement device.

31. The test lead assembly of claim 30, wherein the measurement device is a digital multi-meter, a battery tester, an oscilloscope, or a voltmeter.

* * * * *